United States Patent [19]

Chujo et al.

[11] Patent Number: 5,541,553
[45] Date of Patent: Jul. 30, 1996

[54] AMPLIFIER WITH A FUNCTION FOR SWITCHING ON AND OFF THE OUTPUT SIGNAL

[75] Inventors: Norio Chujo, Fujisawa; Yoshihiko Hayashi, Tokyo; Akio Osaki, Yokohama, all of Japan

[73] Assignee: Hitachi, Ltd., Tokyo, Japan

[21] Appl. No.: 398,678

[22] Filed: Mar. 6, 1995

[30] Foreign Application Priority Data

Mar. 7, 1994 [JP] Japan ................................. 6-035568

[51] Int. Cl.$^6$ ................................. H03F 3/04; H03F 1/52; G01R 31/02
[52] U.S. Cl. ........................ 330/51; 324/763; 324/765; 327/483; 330/298
[58] Field of Search ...................... 330/51, 207 P, 330/298; 324/763, 765; 327/437, 483, 575

[56] References Cited

U.S. PATENT DOCUMENTS 4,165,494  8/1979  Becker ................................. 330/51 X
4,402,029  8/1983  Fujika ............................. 330/207 R X

FOREIGN PATENT DOCUMENTS 54-148358  11/1979  Japan .
5-87579    11/1993  Japan .
6-22976     3/1994  Japan .

*Primary Examiner*—James B. Mullins
*Attorney, Agent, or Firm*—Antonelli, Terry, Stout & Kraus

[57] ABSTRACT

An amplifier which performs the function of switching on and off its output signal includes an inverted Darlington circuit made up of an input transistor and an output transistor, a first switching circuit connected across the base and the emitter of the output transistor, and a second switching circuit connected between the emitter of the input transistor and the collector of the output transistor. Amplifier also includes means for opening the first switching circuit and closing the second switching circuit to send out an output signal, and for closing the first switching circuit and opening the second switching circuit to stop the output signal. The input and output transistors may be fabricated using vipolar or MOSFET technology because current of a small magnitude flows through the switching circuits, the switching circuits can be formed from elements that are small in size and which have small parasitic capacitance. Consequently, amplifier is capable of operating at high speeds but with low power demands. In addition, amplifier can be miniaturized or formed on a single IC chip.

23 Claims, 5 Drawing Sheets

5,541,553

AMPLIFIER WITH A FUNCTION FOR SWITCHING ON AND OFF THE OUTPUT SIGNAL

BACKGROUND OF THE INVENTION

The present invention relates to an amplifier for amplifying various signals, which amplifier is capable of switching on and off its output signal.

It is known to connect a switching circuit to the output of an amplifier circuit to provide the amplifier circuit with the additional function of switching on and off the output signal of the amplifier circuit. Such an amplifier is constructed by connecting a conventional switching circuit, such as a switching circuit employing a diode bridge, as disclosed in Japanese Patent Laid-open (Kokai) No. 54-148358, to a conventional amplifier circuit. In operation, the amplifier provides its output signal when a current is supplied to the diode bridge, and inhibits the output signal when the current supplied to the diode bridge is reduced.

A current which is 1 to 1.5 times greater than the maximum current of the amplifier must be supplied continuously, regardless of the intensity of the output current, to the diode bridge of the switching circuit to accommodate the function for switching on and off the output signal to the amplifier circuit. Amplifiers having an amplifier circuit and a diode bridge in combination therefore operates at a low current efficiency and requires large power, which proves to be a significant disadvantage, particularly when the output current has a high peak value and a small mean value, and in the worst case makes it impossible to design a practical circuit.

Furthermore, the allowable current of the component diodes of the diode bridge must be 1 to 1.5 times greater than the maximum current of the amplifier. The diodes have large dimensions and a large parasitic capacity, and hence, it is difficult to construct a high-speed amplifier with such a switching arrangement.

SUMMARY OF THE INVENTION

It is an objective of the present invention to provide an amplifier which performs the function of switching on and off its output signal, and which is capable of operating at high operating speeds on comparatively low power.

With the foregoing object in view, the present invention provides an amplifier which performs the function of switching on and off its output signal by employing an inverted Darlington circuit made up of a first transistor and a second transistor, with a switching circuit connected across the base and the emitter of the second transistor, through which a comparatively small current flows, and a switching circuit connected between the emitter of the first transistor and the collector of the second transistor.

Since only a small current flows through the switching circuits, the switching circuits can be formed of elements having a small size and a small parasitic capacity. Therefore, the amplifier of the present invention is capable of operating at operating speeds compared with prior art circuits, and can be constructed by using transistors produced by the same process.

When a diode bridge is employed in the switching circuit, the current necessary for controlling the diode bridge can be reduced by half, and hence, the amplifier with a function for switching on and off its output requires comparatively small power.

DETAILED DESCRIPTION OF THE PREFERRED EMBODIMENTS

Figure 1:
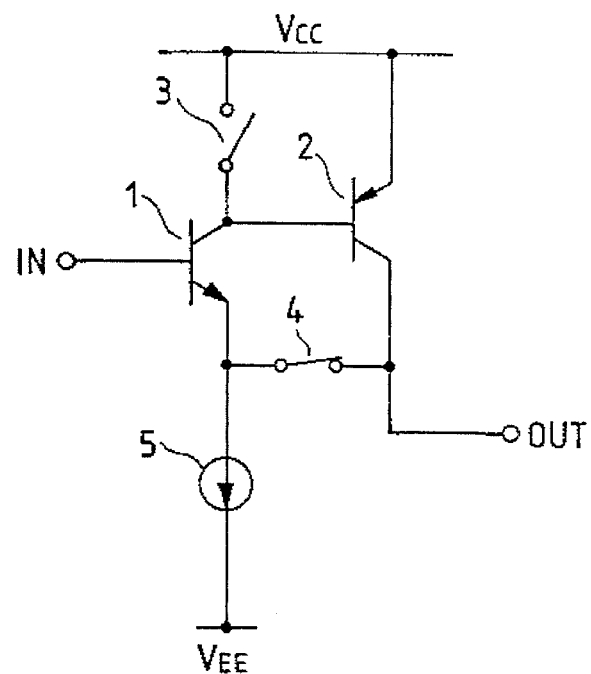
FIG. 1 is a circuit diagram of an amplifier with a function for switching on and off its output signal according to the present invention.

FIG. 1 is a circuit diagram of an amplifier with a function for switching on and off its output signal according to the present invention.

As shown in FIG. 1, the amplifier comprises an inverted Darlington circuit made up of an npn transistor 1, i.e., an input transistor, and a pnp transistor 2, i.e., an output transistor, a switching circuit 3 connected across the base and the emitter of the output transistor 2, a switching circuit 4 connected between the emitter of the input transistor 1 and the collector of the output transistor 2, and a bias circuit 5. When sending out an output signal, the switching circuit 3 is opened and the switching circuit 4 is closed. Since the transistors 1 and 2 are connected so as to form an inverted Darlington circuit, the amplifier with a function has high current gain and provides an amplified current signal on its output terminal.

When inhibiting the output signal, the switching circuit 3 is closed to make the transistor 2 operate in the cutoff region, and the switching circuit 4 is opened to disconnect an emitter follower circuit, including the transistor 1, from the output terminal. Only the collector of the transistor 2 operating in the cutoff region can be seen from the output terminal of the amplifier, and the output impedance of the amplifier increases.

In this embodiment, the two transistors of the amplifier do not operate in the saturation region in both the output mode and the cutoff mode when the input voltage is in an appropriate input voltage range. Therefore, quick switching between an output mode and a cutoff mode is possible.

Furthermore, since the intensity of the current that flows through the transistor 1 may be equal to or less than half the intensity of the current that flows through the transistor 2, the allowable current capacity of the switching circuits 3 and 4 may be equal to or less than half the allowable current capacity of the switching circuit connected to the output of the emitter follower circuit of the amplifier, and hence the elements of the switching circuits 3 and 4 may be of a small size. Since the areas of the switching circuits 3 and 4 are equal to or less than half the area of the switching circuit of the amplifier in which a switching circuit is connected to the output of the emitter follower circuit, the amplifier can be formed in an IC on a single chip having a small area. Since the areas of the switching circuits 3 and 4 are small, the switching circuits 3 and 4 have small parasitic capacities, respectively. Furthermore, even when the amplifier of the present invention is provided with the same transistors as those included in the conventional amplifier of this type, it is capable of operating at an operating speed higher than that of the conventional amplifier.

Figure 2:
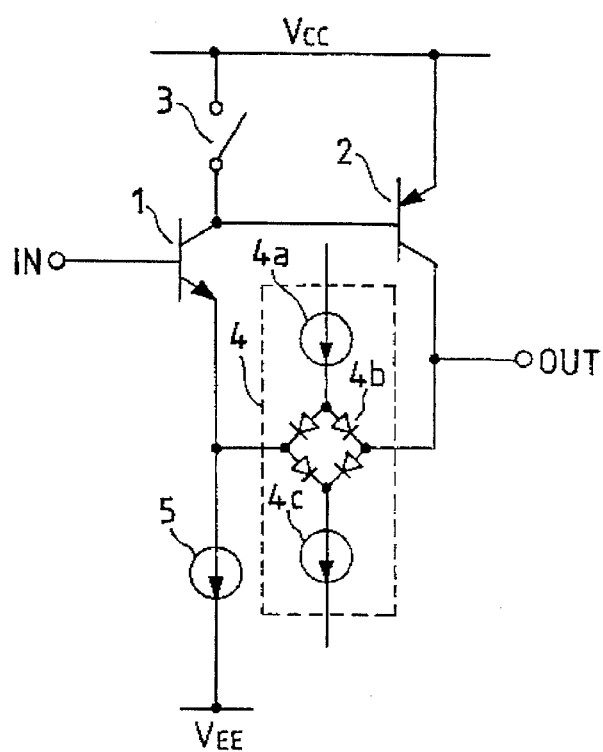
FIG. 2 is a circuit diagram of an amplifier with a function for switching on and off its output signal according to the present invention.

FIG. 2 is a circuit diagram of an amplifier according to the present invention in which the switch 4 is provided as a diode bridge.

Referring to FIG. 2, the amplifier comprises an inverted Darlington circuit made up of an npn transistor 1, i.e., an input transistor, and a pnp transistor 2, i.e., an output transistor, a switching circuit 3 connected across the base and the collector of the output transistor 2, a switching circuit 4 composed of a diode bridge 4b connected between the emitter of the input transistor 1 and the collector of the output transistor 2 and also connected to constant-current sources 4a and 4c, and a bias circuit 5.

When sending out an output signal, the switching circuit 3 is opened and currents are supplied by the current sources 4a and 4c to make the diode bridge 4b conductive. Since the transistors 1 and 2 are connected so as to form an inverted Darlington circuit, the amplifier has high current gain and provides an amplified current signal on an output terminal.

When inhibiting the output signal, the switching circuit 3 is closed to make the transistor 2 operate in the cutoff region, and the currents supplied by the current sources 4a and 4c of the switching circuit 4 are reduced to cutoff the diode bridge 4b, so that the emitter follower circuit including the transistor 1 is disconnected from the output terminal. Only the collector of the transistor 2 operating in the cutoff region can be seen from the output terminal of the amplifier and the output impedance of the amplifier increases.

The current supplied to the transistor 1 is equal to or less than half the current supplied to the transistor 2.

The current capacity of the current source for the switching circuit may be equal to or less than half that of the current source of an amplifier in which a switching circuit composed of a diode bridge and current sources, similar to the switching circuit 4, is connected to the output of an emitter follower circuit. Since the current source of the switching circuit needs to supply a current in the range of a current equal to the maximum current that flows through the switching circuit to 1.5 times the maximum current continuously regardless of the output current, the power consumption of the amplifier in this embodiment is ¾ or less of that of an amplifier having a switching circuit connected to the output of an emitter follower circuit and comprising the same current sources as those of the switching circuit 4 and a diode bridge, when a maximum current is flowing through the amplifier, and is ½ or less of the same when no current is flowing through the amplifier. The reduction in the power consumption is particularly effective in cases where an output current having a large peak value and a small mean value is used for driving, for example, a CMOS unit or a TTL circuit.

Since the power consumption is small, the amplifier generates less heat energy and can be formed in an IC on a single chip.

Figure 3:
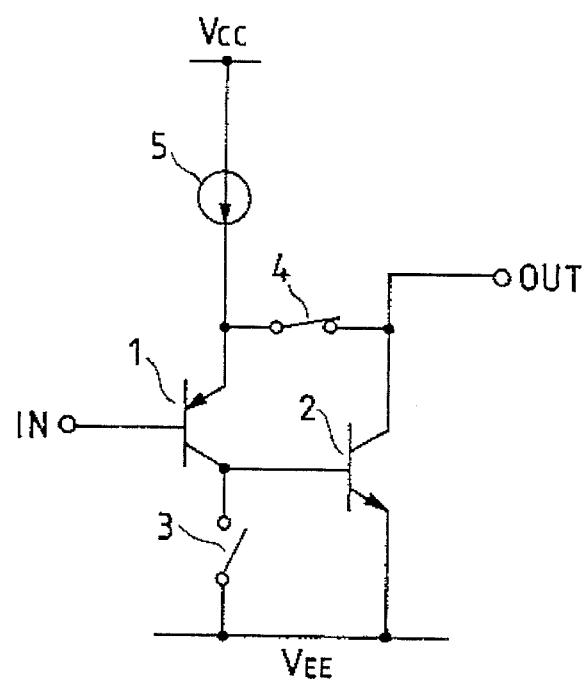
FIG. 3 is a circuit diagram of an amplifier with a function for switching on and off its output signal according to the present invention.

FIG. 3 is a circuit diagram of an amplifier according to the present invention in which the power supply is connected differently from that of FIG. 1.

Referring to FIG. 3, the amplifier comprises an inverted Darlington circuit made up of a pnp transistor 1, i.e., an input transistor, and an npn transistor 2, i.e., an output transistor, a switching circuit 3 connected across the base and the emitter of the output transistor 2, a switching circuit 4 connected between the emitter of the input transistor 1 and the collector of the output transistor 2, and a bias circuit 5. When sending out an output signal, the switching circuit 3 is opened and the switching circuit 4 is closed. Since the transistors 1 and 2 are connected so as to form an inverted Darlington circuit, the amplifier has a high current gain and provides an amplified current on an output terminal. When inhibiting the output signal, the switching circuit 3 is closed to make the transistor 2 operate in the cutoff region, and the switching circuit 4 is opened to disconnect an emitter follower circuit including the transistor 1 from the output terminal. Only the collector of the transistor 2 operating in the cutoff region can be seen from the output terminal of the amplifier and the output impedance of the amplifier circuit increases.

The switching circuit 4 may be replaced by the switching circuit 4 shown in FIG. 2, comprising the diode bridge and the constant-current sources.

Figure 4:
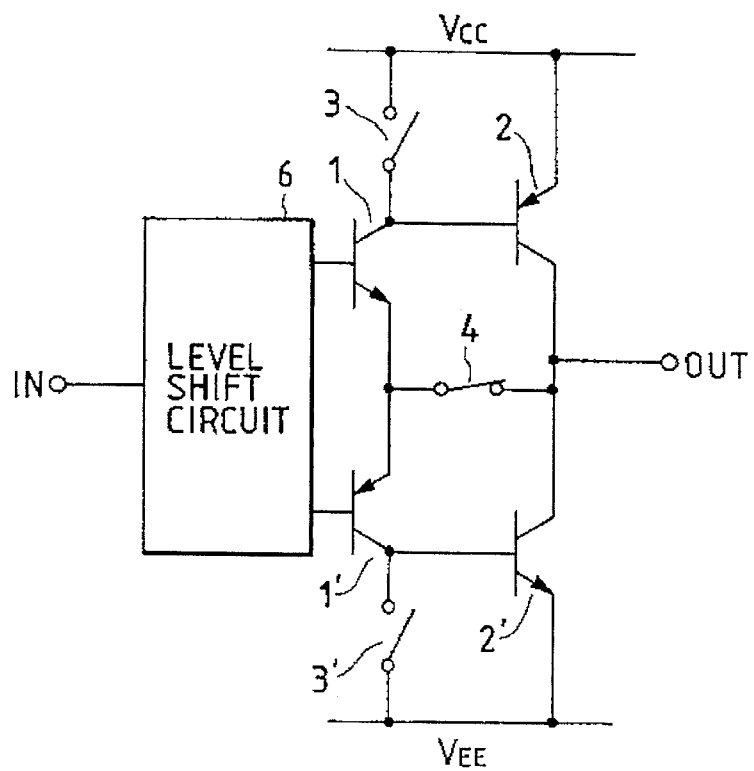
FIG. 4 is a circuit diagram of an amplifier with a function for switching on and off its output signal according to the present invention.

FIG. 4 is a circuit diagram of an amplifier according to the present invention in which two inverted Darlington connected transistor pairs are provided.

Referring to FIG. 4, the amplifier comprises a first inverted Darlington circuit comprising an npn transistor 1, i.e., an input transistor, and a pnp transistor 2, i.e., an output transistor, a switching circuit 3 connected across the base and the emitter of the output transistor 2, a second inverted Darlington circuit comprising a pnp transistor 1', i.e., an input transistor, and an npn transistor 2', i.e., an output transistor, a switching circuit 3' connected across the base and the emitter of the output transistor 2', a switching circuit 4 connected between the emitters of the input transistors 1 and 1' and the collectors of the output transistors 2 and 2', and a level shifting circuit 6

When sending out an output signal, the switching circuits 3 and 3' are opened and the switching circuit 4 is closed. Since the transistors 1 and 2 are connected so as to form the first inverted Darlington circuit and the transistors 1' and 2' are connected so as to form the second inverted Darlington circuit, the transistors 1 and 1' and the transistors 2 and 2' form push-pull circuits, and so the amplifier has a high current gain and provides an amplified current on an output terminal.

When inhibiting the output signal, the switching circuits 3 and 3' are closed to make the transistors 2 and 2' operate in the cutoff region, and the switching circuit 4 is opened to disconnect the push-pull circuit including the transistors 1 and 1' from the output terminal. Only the collectors of the transistors 2 and 2' operating in the cutoff region can be seen from the output terminal of the amplifier, and the output impedance of the amplifier increases.

The push-pull amplifier circuits employed in this embodiment exert high-speed output cutoff functions.

The switching circuit 4 may be replaced by the switching circuit in FIG. 2, having the diode bridge and the constant-current sources. In such a case, the current capacity of the current source for the switching circuit may be equal to or less than half that of an amplifier in which a switching circuit comprising the current sources and the diode bridge in combination is connected to the output of the push-pull circuit. The current source of the switching circuit needs to supply a current in the range of a current equal to the maximum current of the switching circuit to 1.5 times the maximum current regardless of the intensity of the output current. Accordingly, the power consumption of the amplifier in this embodiment is ¾ or less of that of the conventional amplifier in which a switching circuit comprising current sources and the diode bridge is connected to the output of a push-pull circuit, and is ½ or less of the power consumption of the same conventional amplifier when no current is flowing. The reduction of power consumption is particularly effective in the case where an output current having a large peak value and a small mean value is used for driving, for example, a CMOS unit or a TTL circuit.

Since the power consumption is small, the amplifier generates less heat energy and can be formed in an IC on a single chip.

Figure 5:
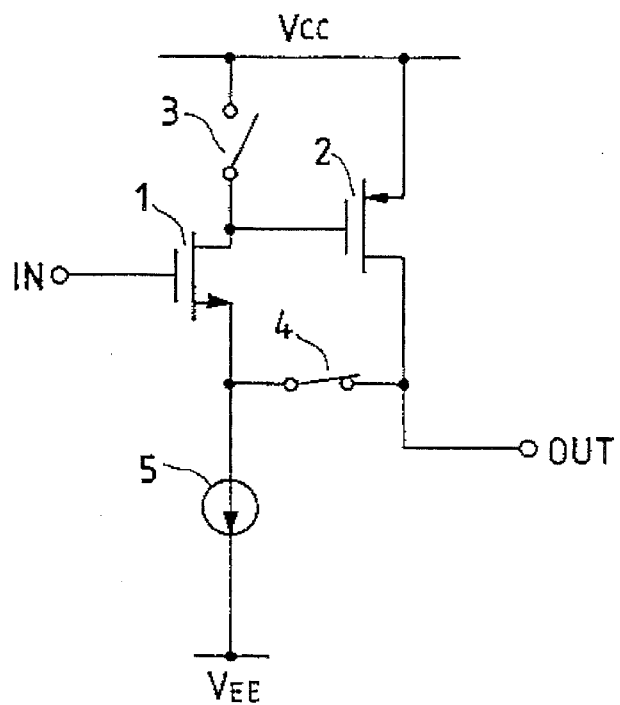
FIG. 5 is a circuit diagram of an amplifier with a function for switching on and off its output signal according to the present invention.

FIG. 5 is a circuit diagram of an amplifier according to the present invention in which MOS transistors are employed.

Referring to FIG. 5, the amplifier comprises an inverted Darlington circuit made up of an n-channel MoS transistor 1, i.e., an input transistor, and a p-channel MOS transistor 2, i.e., an output transistor, a switching circuit 3 connected across the gate and the source of the output transistor 2, a switching circuit 4 connected between the source of the input transistor 1 and the drain of the output transistor 2, and a bias circuit 5.

When sending out an output signal, the switching circuit 3 is opened and the switching circuit 4 is closed. Since the transistors 1 and 2 form an inverted Darlington circuit, the amplifier has a high current gain and provides an amplified current at an output terminal. When inhibiting the output signal, the switching circuit 3 is closed to make the transistor 2 operate in the cutoff region, and the switching circuit 4 is opened to disconnect a source follower circuit including the transistor 1 from the output terminal. Only the collector of the transistor 2 operating in the cutoff region can be seen from the output terminal of the amplifier and the output impedance of the amplifier increases.

The amplifier, described with reference to FIG. 3, may use a p-channel MOS transistor as an input transistor, and an n-channel MOS transistor as an output transistor.

The amplifier, described with reference to FIG. 4, may be a push-pull amplifier comprising an inverted Darlington circuit made up of an n-channel MOS transistor as an input transistor and a p-channel MOS transistor as an output transistor, and an inverted Darlington circuit made up of a p-channel MOS transistor as an input transistor and an n-channel MOS transistor as an output-end transistor.

The switching circuit 4 may be replaced by the switching circuit made up of the diode bridge and the constant-current sources shown in FIG. 2.

Figure 6:
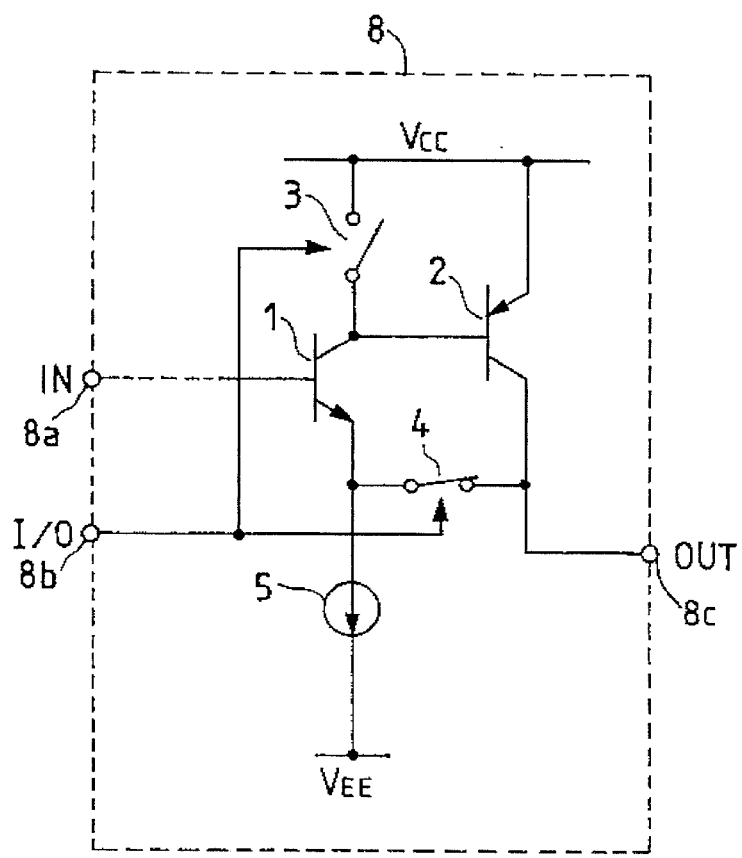
FIG. 6 is a circuit diagram of a monolithic IC provided with an amplifier having a function for switching on and off its output signal in accordance with the present invention.

FIG. 6 is a circuit diagram of an a monolithic IC provided with amplifier according to the present invention.

Referring to FIG. 6, the amplifier comprises an inverted Darlington circuit made up of an npn transistor 1, i.e., an input transistor, and a pnp transistor 2, i.e., an output transistor, a switching circuit 3 connected between the base and the collector of the output transistor 2, a switching circuit 4 connected across the emitter of the input transistor 1 and the collector of the output transistor 2, and a bias circuit 5. The amplifier, or a circuit formed by connecting another circuit to the input side of the amplifier, is formed in an IC on a single chip.

The chip is provided with an input signal terminal 8a for the amplifier, or the circuit connected to the input side of the amplifier, a signal terminal 8b to which there may be applied a signal that sets the amplifier for a signal output state or a signal cutoff state, and an output terminal 8c for the amplifier.

When sending out an output signal, an off signal is applied to the signal terminal 8b to open the switching circuit 3 and to close the switching circuit 4. The transistors 1 and 2 are connected so as to form an inverted Darlington circuit. The amplifier has a high current gain and provides an amplified current at the output terminal 8c.

When inhibiting the output signal, a signal is applied to the signal terminal 8b to close the switching circuit 3 to make the transistor 2 operate in the cutoff region, and to open the switching circuit 4 to disconnect an emitter follower circuit including the transistor 1 from the output terminal 8c. Only the collector of the transistor 2 operating in the cutoff region can be seen from the output terminal 8c and the output impedance of the amplifier increases.

The amplifier formed in an IC may use a pnp transistor as an input transistor and an npn transistor as an output transistor as shown in FIG. 3, may be a push-pull amplifier having an inverted Darlington circuit made up of an input npn transistor and an output pnp transistor, and an inverted Darlington circuit made up of an input pnp transistor and an output npn transistor as shown in FIG. 4, may use an input n-channel MOS transistor and an output p-channel MOS transistor as shown in FIG. 5, may use an input p-channel MOS transistor and an output n-channel MOS transistor as shown in FIG. 3, or may be a push-pull amplifier having an inverted Darlington circuit made up of an input n-channel MOS transistor and an output p-channel MOS transistor and an inverted Darlington circuit made up of an input p-channel MOS transistor and an output n-channel MOS transistor as shown in FIG. 4.

Furthermore, the switching circuit 4 may be replaced by the switching circuit 4 made up of the diode bridge and the constant-current sources shown in FIG. 2.

Figure 7:
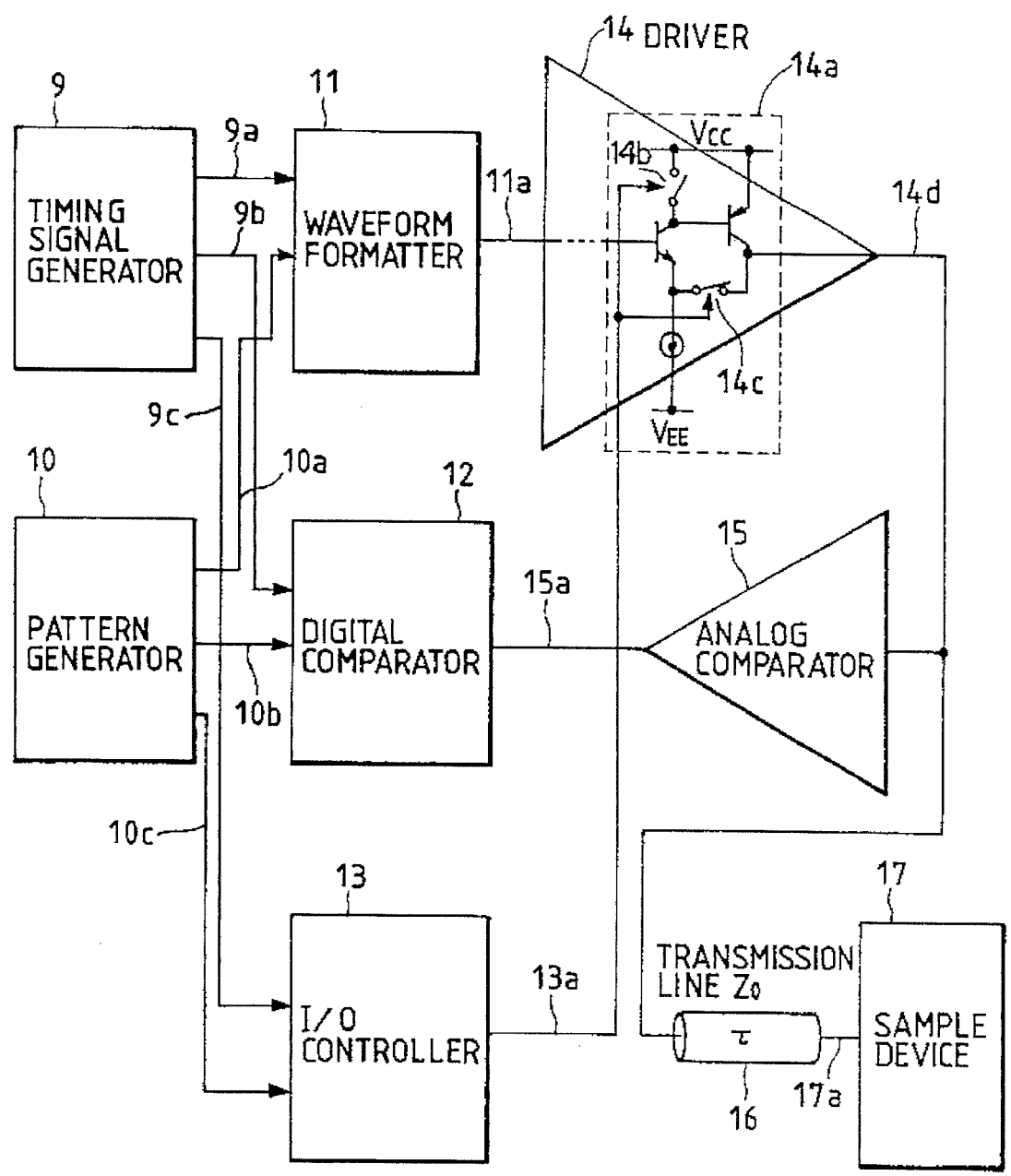
FIG. 7 is a block diagram of a semiconductor device testing system employing an amplifier, with a function for switching on and off its output signal in accordance with the present invention, as a driver.

FIG. 7 is a block diagram of a semiconductor device testing system employing an amplifier with a function for switching on and off its output signal in accordance with the present invention.

Referring to FIG. 7, the semiconductor device testing system comprises a timing signal generator 9, a pattern generator 10, a waveform formatter 11, a digital comparator 12, an I/O controller 13, a driver 14 provided with an amplifier 14a in accordance with the present invention as an output circuit, an analog comparator 15, and a transmission line 16 electrically connected to a sample device 17. The I/O controller 13 combines a timing signal 9c generated by the timing signal generator 9 and a pattern signal 10c generated by the pattern generator 10, and opens the switching circuit 14b of the amplifier 14a, included in the driver 14, and closes the switching circuit 14c of the amplifier 14a to set the amplifier 14a of the driver 14 to an output state. The waveform formatter 11 combines the timing signal 9a generated by the timing signal generator 9 and a test pattern 10a generated by the pattern generator 10 and gives an output signal 11a to the driver 14, and then the driver supplies a test waveform signal 14d corresponding to the output 11a of the waveform formatter 11 through the transmission line 16 to the sample device 17.

The I/O controller 13 combines the timing signal 9c generated by the timing signal generator 9 and the pattern signal 10c generated by the pattern generator 10, and operates to close the switching circuit 14b of the amplifier 14a included in the driver 14 and open the switching circuit 14c of the amplifier 14a to set the amplifier 14a included in the driver 14 to a cutoff state to allow the analog comparator 15 to receive an output signal 17a provided by the sample device 17. The output signal 17a of the sample device 17 is converted into a digital value "0" or "1" by voltage conversion by the analog comparator 15, and then the digital comparator 12 compares the digital value at a time specified by the timing signal 9b with an expected value 10b provided by the pattern generator 10 and representing an expected response of a non-defective device.

The amplifier 14a included in the driver 14 may be the amplifier shown in FIG. 3 made up of the input pnp transistor and the output npn transistor, the push-pull amplifier shown in FIG. 4 comprising the inverted Darlington circuit made up of the input npn transistor and the output pnp transistor, and the inverted Darlington circuit made up of the input pnp transistor and the output npn transistor, the amplifier shown in FIG. 5 made up of the input n-channel MOS transistor and the output p-channel MOS transistor, an amplifier, similar to the amplifier shown in FIG. 3, made up of an input p-channel MOS transistor and an output n-channel MOS transistor or a push-pull amplifier, similar to the amplifier shown in FIG. 4, comprising an inverted Darlington circuit made up of an input n-channel MOS transistor and an output p-channel MOS transistor, and an inverted Darlington circuit made up of an input p-channel MOS transistor and an output n-channel MoS transistor.

Furthermore, the switching circuit 14c may be replaced by the switching circuit 4 comprising the diode bridge and the constant-current sources shown in FIG. 2.

The semiconductor device testing system must be provided with one driver 14 for each of the pins of the sample device 17. Therefore, the semiconductor device testing system has several tens of drivers. The semiconductor device testing system can be miniaturized by miniaturizing each driver having an I/O switching function through miniaturization of the amplifier 14a of the present invention included in each driver. Even when provided with more drivers than the conventional semiconductor device testing system of the same size, the semiconductor device testing system employing the amplifiers 14a of the present invention is able to test a sample device having more pins than a sample device which can be tested by the conventional semiconductor device testing system and to test an increased number of sample devices simultaneously, and thereby the testing cost can be reduced. The lower power demand of the amplifiers 14a of the present invention, included in the drivers, reduces the power demand of the drivers having an I/O switching function and, consequently, the power demand of the semiconductor device testing system can be reduced.

The output capacity of the driver of the semiconductor device testing system employing the amplifier of the present invention, when cutting off the driver, as compared with that of a driver in which a switching circuit is connected to the output of the amplifier 14a for providing an I/O switching function, may be small. Therefore, the semiconductor device testing system is able to measure the output signal 17a of the sample device 17 using the analog comparator 15 more accurately than a semiconductor device testing system having drivers and a switching circuit connected to the output of the amplifier included in each driver for providing an I/O switching function.

The reduction of power demand and the reduction of the area of the switching circuit in the driver 14 formed in an IC make it possible to form the drivers 14 in an IC on a single chip, to form the drivers 14 and the analog comparator 15 in an IC on a single chip, to form the drivers 14, the analog comparator 15 and the waveform formatter 11 in an IC on a single chip, to form the drivers 14, the analog comparator 15, the waveform formatter 11, the timing signal generator 9 and the digital comparator 12 in an IC on a single chip or to form the drivers 14, the analog comparator 15, the waveform formatter 11, the timing signal generator 9, the digital comparator 12 and the pattern generator 10 in an IC on a single chip. Therefore, the semiconductor device testing system can be miniaturized, and the semiconductor device testing system is able to test a sample device having more pins than a sample device which can be tested by a conventional semiconductor device testing system of the same size and to test an increased number of sample devices simultaneously to reduce the testing cost.

Figure 8:
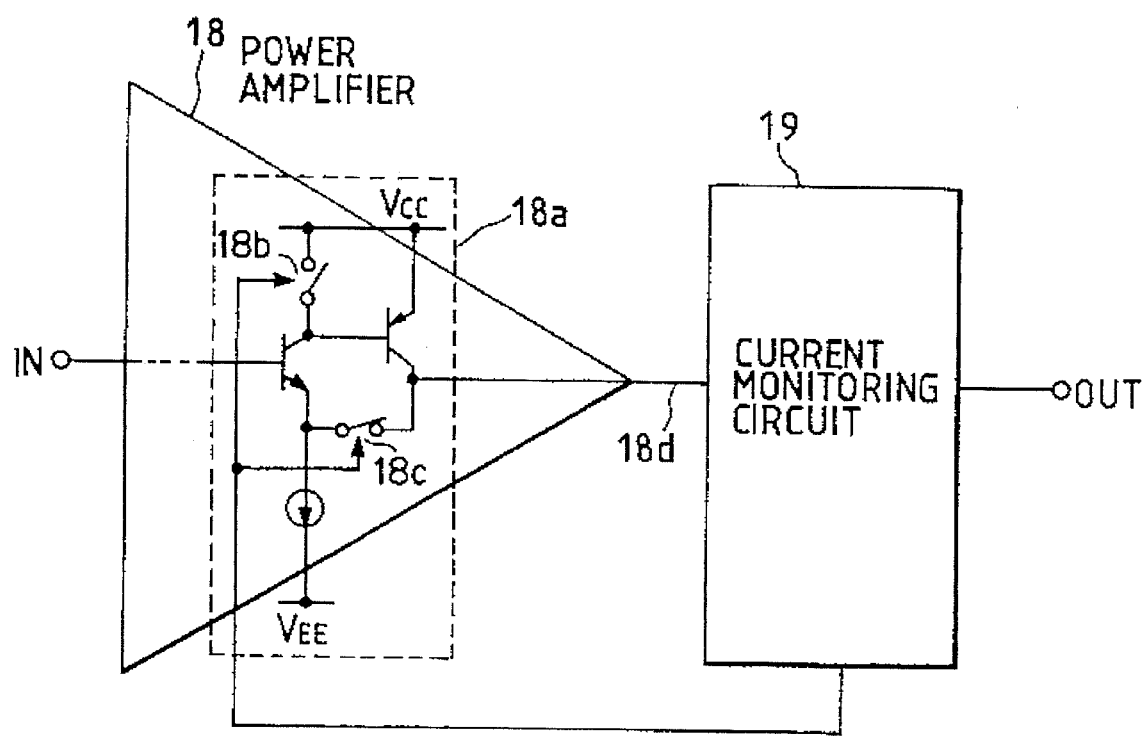
FIG. 8 is a block diagram of a power amplifier with an overload protective function provided with an amplifier with a function for switching on and off its output signal.

FIG. 8 is a block diagram of a power amplifier with an overload protective function incorporating an amplifier with a function for switching on and off its output signal according to the present invention.

Referring to FIG. 8, The power amplifier with an overload protective function comprises a power amplifier circuit 18 provided with an amplifier 18a embodying the present invention on its output side, and a current monitoring circuit 19.

In the amplifier 18a of the power amplifier circuit 18, a switching circuit 18b is opened and a switching circuit 18c is closed. The power amplifier circuit 18 amplifies a signal applied to its input terminal and provides an output current 18d. The current monitoring circuit 19 monitors the output current 18d of the power amplifier circuit 18, and closes the switching circuit 18b of the amplifier 18a and opens the switching circuit 18c of the amplifier 18a when the load connected to the output terminal of the power amplifier increases excessively beyond a limit and the output current 18d of the power amplifier circuit 18 increases beyond a given limit current. Then, the output impedance of the power amplifier circuit 18 increases to prevent damage to the transistors of the power amplifier circuit 18 due to an excessive current.

The amplifier 18a of the power amplifier circuit 18 may be an amplifier as shown in FIG. 3 provided with an input pnp transistor and an output npn transistor, may be a push-pull amplifier as shown in FIG. 4 having an inverted Darlington circuit made up of an input npn transistor and an output pnp transistor, and an inverted Darlington circuit made up of an input pnp transistor and an output npn transistor, may be an amplifier as shown in FIG. 5 provided with an input n-channel MOS transistor and an output p-channel MOS transistor, may be an amplifier, similar to that shown in FIG. 3, provided with an input p-channel MOS transistor and an output n-channel MOS transistor or may be a push-pull amplifier, similar to that shown in FIG. 4, provided with an inverted Darlington circuit made up of an input n-channel MOS transistor and an output p-channel MOS transistor, and an inverted Darlington circuit made up of an input p-channel MOS transistor and an output n-channel MOS transistor.

As is apparent from the foregoing description, the amplifier with a function for switching on and off its output signal according to the present invention can be miniaturized, is capable of operating at a high operating speed and demands small power because the current that flows through the switching circuits can be reduced, and hence the amplifier can be formed in an IC on a single chip.

What is claimed is:

1. An amplifier with a function for switching on and off its output signal, comprising: an inverted Darlington circuit made up of an input transistor and an output transistor; a first switching circuit connected across the base and the emitter of the output transistor; and a second switching circuit connected between the emitter of the input transistor and the collector of the output transistor.

2. An amplifier according to claim 1, further comprising means for opening the first switching circuit and closing the second switching circuit to send out an output signal, and for closing the first switching circuit and opening the second switching circuit to stop the output signal.

3. An amplifier according to claim 1, wherein the intensity of the current that flows through the switching circuits is not higher than half that of the output current of the amplifier.

4. An amplifier according to claim 1, and further comprising a second inverted Darlington circuit, wherein said first-mentioned and second inverted Darlington circuits are connected in a push-pull circuit arrangement.

5. An amplifier according to claim 1, wherein said output signal is used to drive one of a group consisting of a CMOS unit and a TTL circuit.

6. An amplifier according to claim 1, wherein said inverted Darlington circuit and said first and second switching elements are formed in an monolithic IC single chip.

7. An amplifier according to claim 1, wherein said second switching circuit comprises a diode bridge circuit.

8. A semiconductor device testing system comprising: a timing signal generator; a pattern generator; a waveform formatter connected to receive a timing signal generated by the timing signal generator and a test pattern generated by the pattern generator; a driver, with an I/O switching function, that is connected to receive an output signal of the waveform formatter and a control signal that causes its output impedance to increase when a sample device to be tested provides an output signal; a transmission line for transmitting an output testing signal of the driver to the sample device; an analog comparator connected to receive an output signal provided by the sample device in response to the testing signal supplied through the transmission line for comparing the output signal provided by the sample device with a reference voltage; and a digital comparator that compares an output signal of the analog comparator and an expected value generated by the pattern generator for logical comparison at a time specified by a timing signal generated by the timing signal generator; said driver including an inverted Darlington circuit made up of an input transistor and an output transistor, a first switching circuit connected across the base and the emitter of the output transistor, and a second switching circuit connected between the emitter of the input transistor and the collector of the output transistor, said first and second switching circuits being connected to receive said control signal to control the I/O switching function of said driver.

9. An amplifier with a function for switching on and off its output signal comprising:

an inverted Darlington circuit which includes an input transistor and an output transistor;

a first switching circuit connected across a gate and a source of the output transistor; and a second switching circuit connected between a source of the input transistor and a drain of the output transistor.

10. The amplifier recited in claim 9, further comprising:

means for opening the first switching circuit and closing the second switching circuit to send out an output signal, and for closing the first switching circuit and opening the second switching circuit to stop the output signal.

11. The amplifier recited in claim 9, wherein said input and output transistors are fabricated using CMOS technology.

12. The amplifier recited in claim 9, wherein said second switching circuit comprises a diode bridge circuit.

13. The amplifier recited in claim 9, further comprising:

a second inverted Darlington circuit, wherein said first-mentioned and said second inverted Darlington circuits are connected in a push-pull circuit arrangement.

14. The amplifier recited in claim 9, wherein the amplifier is formed on a single IC chip.

15. A power amplifier circuit, comprising:

an amplifier circuit having an inverted Darlington circuit which includes an input transistor in an output transistor, a first switching circuit connected across the base and the emitter of the output transistor, and a second switching circuit connected between the emitter of the input transistor and the collector of the output transistor; and a current monitoring circuit for monitoring the output signal of said amplifier circuit, said circuit monitoring circuit having an input terminal for receiving the output signal, a control terminal connected to the first and second switching circuits of said amplifier circuit, and means for providing a signal on said control terminal for closing said first switching means and opening said second switching means when said output signal of said amplifier circuit exceeds a predetermined limit.

16. The power amplifier circuit recited in claim 15, further comprising:

means for opening the first switching circuit and closing the second switching circuit to send out the output signal, and for closing the first switching circuit and opening the second switching circuit to stop the output signal.

17. The power amplifier circuit recited in claim 15, further comprising:

a second inverted Darlington circuit, wherein said first-mentioned and said second inverted Darlington circuits are connected in a push-pull circuit arrangement.

18. The power amplifier circuit recited in claim 15, wherein said second switching circuit comprises a diode bridge circuit.

19. The power amplifier circuit recited in claim 15, wherein the power amplifier circuit is formed on a single IC chip.

20. A power amplifier circuit, comprising:

an amplifier circuit having an inverted Darlington circuit which includes an input transistor and an output transistor, a first switching circuit connected across a gate and a source of the output transistor, and a second switching circuit connected between a source of the input transistor and a drain of the output transistor; and a current monitoring circuit for monitoring an output signal of said amplifier circuit, said current monitoring circuit having an input terminal for receiving the output signal, a control terminal connected to the first and second switching circuits of said amplifier circuit, and means for providing a signal on said control terminal for closing said first switching means and for opening said second switching means when the output signal of said amplifier circuit exceeds a predetermined limit.

21. The power amplifier circuit recited in claim 20, further comprising:

means for opening the first switching circuit and closing the second switching circuit to send out the output signal, and for closing the first switching circuit and opening the second switching circuit to stop the output signal.

22. The power amplifier circuit recited in claim 20, wherein said input and output transistors are fabricated using CMOS technology.

23. The power amplifier circuit recited in claim 20, wherein said power amplifier circuit is formed on a single IC chip.

* * * * *